(12) United States Patent
Irving et al.

(10) Patent No.: US 7,846,644 B2
(45) Date of Patent: *Dec. 7, 2010

(54) PHOTOPATTERNABLE DEPOSITION INHIBITOR CONTAINING SILOXANE

(75) Inventors: Lyn M. Irving, Rochester, NY (US); David H. Levy, Rochester, NY (US); Diane C. Freeman, Pittsford, NY (US); Cheng Yang, Pittsford, NY (US); Peter J. Cowdery-Corvan, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 447 days.

This patent is subject to a terminal disclaimer.

(21) Appl. No.: 11/942,780

(22) Filed: Nov. 20, 2007

(65) Prior Publication Data

US 2009/0130608 A1    May 21, 2009

(51) Int. Cl.
*G03F 7/26* (2006.01)
*G03F 7/075* (2006.01)
(52) U.S. Cl. .................................. 430/313; 430/270.1
(58) Field of Classification Search ............... 430/313, 430/311, 324, 270.1, 314
See application file for complete search history.

(56) References Cited

U.S. PATENT DOCUMENTS

| 4,284,706 A | | 8/1981 | Clecak et al. | |
|---|---|---|---|---|
| 4,394,434 A | * | 7/1983 | Rohloff | 430/270.1 |
| 4,692,205 A | | 9/1987 | Sachdev et al. | |
| 5,422,223 A | | 6/1995 | Sachdev et al. | |
| 7,160,819 B2 | | 1/2007 | Conley, Jr. et al. | |
| 2004/0142276 A1 | * | 7/2004 | Arai et al. | 430/270.1 |
| 2006/0240662 A1 | * | 10/2006 | Conley et al. | 438/625 |

OTHER PUBLICATIONS

JP Abstract 2005274590 (Jun. 10, 2005), "Photosensitive Resin Composition and Method for Forming Resist Pattern" by Toshiki.
Ashwini Sinha, et al., "Area selective atomic layer deposition of titanium dioxide: Effect of precursor chemistry," pp. 2523-2532, J. Vac. Sci. Technol. B 24(6), Nov./Dec. 2006.

* cited by examiner

*Primary Examiner*—Kathleen Duda
*Assistant Examiner*—Caleen O Sullivan
(74) *Attorney, Agent, or Firm*—Chris P. KonKol; J. Lanny Tucker

(57) ABSTRACT

An atomic-layer-deposition process for forming a patterned thin film comprising providing a substrate, applying a photopatternable deposition inhibitor material to the substrate, wherein the deposition inhibitor material comprises an organosiloxane compound; and patterning the deposition inhibitor material. The thin film is substantially deposited only in the selected areas of the substrate not having the deposition inhibitor material.

17 Claims, 4 Drawing Sheets

PHOTOPATTERNABLE DEPOSITION INHIBITOR CONTAINING SILOXANE

CROSS-REFERENCE TO RELATED APPLICATIONS

Reference is made to commonly assigned U.S. patent application Ser. No. 11/437,923 filed May 19, 2006 by Irving et al. and entitled "COLORED MASKING FOR FORMING TRANSPARENT STRUCTURES," U.S. application Ser. No. 11/986,169, filed concurrently by Irving et al. and entitled, "COLORED MASK COMBINED WITH SELECTIVE AREA DEPOSITION," U.S. application Ser. No. 11/986,102, filed concurrently by Irving et al. and entitled "MULTICOLOR MASK," U.S. application Ser. No. 11/986,068, filed concurrently by Irving et al. and entitled "INTEGRATED COLOR MASK," U.S. application Ser. No. 11/986,189, filed concurrently by Irving et al. and entitled, "GRADIENT COLORED MASK," and U.S. application Ser. No. 11/986,088, filed concurrently by Irving et al. and entitled, "MULTICOLORED MASK. PROCESS FOR MAKING DISPLAY CIRCUITRY." All the above-identified applications incorporated by reference in their entirety.

FIELD OF THE INVENTION

This invention relates to process for forming a patterned film by selective area deposition. In particular, the present invention relates to a process employing compositions containing organosiloxane compounds that are photopatternable as a deposition inhibitor compound.

BACKGROUND OF THE INVENTION

Modern-day electronics require multiple patterned layers of electrically or optically active materials, sometimes over a relatively large substrate. Electronics such radio frequency identification (RFID) tags, photovoltaics, optical and chemical sensors all require some level of patterning in their electronic circuitry. Flat panel displays, such as liquid crystal displays or electroluminescent displays (ex. OLED), rely upon accurately patterned sequential layers to form thin film components of the backplane. These components include capacitors, transistors, and power buses. The industry is continually looking for new methods of materials deposition and layer patterning for both performance gains and cost reductions.

Thin film transistors (TFTs) may be viewed as representative of the electronic and manufacturing issues for many thin film components. TFTs are widely used as switching elements in electronics, for example, in active-matrix liquid-crystal displays, smart cards, and a variety of other electronic devices and components thereof. The thin film transistor (TFT) is an example of a field effect transistor (FET). The best-known example of an FET is the MOSFET (Metal-Oxide-Semiconductor-FET), today's conventional switching element for high-speed applications. For applications in which a transistor needs to be applied to a substrate, a thin film transistor is typically used. A critical step in fabricating the thin film transistor involves the deposition of a semiconductor onto the substrate. Presently, most thin film devices are made using vacuum deposited amorphous silicon as the semiconductor, which is patterned using traditional photolithographic methods.

Amorphous silicon as a semiconductor for use in TFTs still has its drawbacks. The deposition of amorphous silicon, during the manufacture of transistors, requires relatively difficult or complicated processes such as plasma enhanced chemical vapor deposition and high temperatures (typically about 360° C.) to achieve the electrical characteristics sufficient for display applications. Such high processing temperatures disallow deposition on substrates made of certain plastics that might otherwise be desirable for use in applications such as flexible displays.

There is a growing interest in depositing thin film semiconductors on plastic or flexible substrates, particularly because these supports would be more mechanically robust, lighter weight, and allow more economic manufacturing, for example, by allowing roll-to-roll processing. A useful example of a flexible substrate is polyethylene terephthalate. Such plastics, however, limit device processing to below 200° C.

In spite of the potential advantages of flexible substrates, there are many issues associated with plastic supports when using traditional photolithography during conventional manufacturing, making it difficult to perform alignments of transistor components across typical substrate widths up to one meter or more. Traditional photolithographic processes and equipment may be seriously impacted by the substrate's maximum process temperature, solvent resistance, dimensional stability, water, and solvent swelling, all key parameters in which plastic supports are typically inferior to glass.

There is interest in utilizing lower cost processes for deposition that do not involve the expense associated with vacuum processing and subtractive patterning processes. In typical vacuum processing, a large metal chamber and sophisticated vacuum pumping systems are required in order to provide the necessary environment. In typical subtractive patterning systems, much of the material deposited in the vacuum chamber is removed, for example in an etch step. These deposition and patterning methods have high capital costs and preclude the easy use of continuous web based systems.

In the past decade, various materials have received attention as a potential alternative to amorphous silicon for use in semiconductor channels of thin film transistors. Semiconductor materials are desirable that are simpler to process, especially those that are capable of being applied to large areas by relatively simple processes. Semiconductor materials that can be deposited at lower temperatures would open up a wider range of substrate materials, including plastics, for flexible electronic devices. Dielectric materials that are easily processable and patternable are also key to the success of low cost and flexible electronic devices.

The discovery of practical inorganic semiconductors as a replacement for current silicon-based technologies has also been the subject of considerable research efforts. For example, metal oxide semiconductors are known that constitute zinc oxide, indium oxide, gallium indium zinc oxide, tin oxide, or cadmium oxide deposited with or without additional doping elements including metals such as aluminum. Such semiconductor materials, which are transparent, can have an additional advantage for certain applications, as discussed below. Additionally, metal oxide dielectrics such as alumina ($Al_2O_3$) and $TiO_2$ are useful in practical electronics applications as well as optical applications such as interference filters.

A number of device structures can be made with the functional layers described above. A capacitor results from placing a dielectric between two conductors. A diode results from placing two semiconductors of complementary carrier type between two conducting electrodes. There may also be disposed between the semiconductors of complementary carrier type a semiconductor region that is intrinsic, indicating that that region has low numbers of free charge carriers. A diode may also be constructed by placing a single semiconductor between two conductors, where one of the conductor/semiconductors interfaces produces a Schottky barrier that impedes current flow strongly in one direction. A transistor results from placing upon a conductor (the gate) an insulating layer followed by a semiconducting layer. If two or more additional conductor electrodes (source and drain) are placed spaced apart in contact with the top semiconductor layer, a transistor can be formed. Any of the above devices can be created in various configurations as long as the critical interfaces are created.

There is growing interest in a technology known as selective area deposition, or SAD. As the name implies, selective area deposition involves treating portion(s) of a substrate such that a material is deposited only in those areas that are desired, or selected. For example, Sinha et al. (J. Vac. Sci. Technol. B 24 6 2523-2532 (2006)) have remarked that selective area ALD (Atomic Layer Deposition) requires that designated areas of a surface be masked or "protected" to prevent ALD reactions in those selected areas, thus ensuring that the ALD film nucleates and grows only on the desired unmasked regions. It is also possible to have SAD processes where the selected areas of the surface area are "activated" or surface modified in such a way that the film is deposited only on the activated areas. There are many potential advantages to selective area deposition techniques, such as eliminating an etch process for film patterning, reduction in the number of cleaning steps required, and patterning of materials which are difficult to etch. One approach to combining patterning and depositing the semiconductor is shown in U.S. Pat. No. 7,160,819 entitled "METHOD TO PERFORM SELECTIVE ATOMIC LAYER DEPOSITION OF ZINC OXIDE" by Conley, Jr. et al. Conley, Jr. et al. discuss materials for use in patterning Zinc Oxide on silicon wafers. No information is provided on the use of other substrates, or the results for other metal oxides.

A number of materials have been used by researchers as director inhibitor compounds for selective area deposition. Sinha et al., referenced above, use poly(methyl methacrylate (PMMA) in their masking layer. Conley, Jr. et al. employed acetone and deionized water, along with other process contaminants as deposition inhibitor materials. The problem with these previously used director inhibitors is that they are only effective to direct selected thin materials. Additionally, in order to be useful in constructing devices, director inhibitor compounds need to be patterned. Additive methods of patterning director inhibitors, such as lithography or inkjet are limited in their resolution. Also, there remains a difficulty in aligning the different layers in a final device that cannot be resolved by selective area deposition alone. Therefore, there is a need for a director inhibitor compound that can work with a range of thin film materials, is easily patterned, and is suited to highly accurate patterning in a simple way.

SUMMARY OF THE INVENTION

The present invention relates to photopatternable director inhibitor materials for use with vapor phase deposition processes. Such a process for forming a patterned thin film comprises:
  (a) providing a substrate;
  (b) applying a composition comprising a photopatternable deposition inhibitor material to the substrate, wherein the deposition inhibitor material comprises an organosiloxane;
  (c) exposing the photopatternable deposition inhibitor material to imaging actinic radiation to form a pattern which is composed of deposition inhibitor material in a second exposed state that is different from an first as-coated state;
  (d) patterning the deposition inhibitor material to provide selected areas effectively not having the deposition inhibitor material by processing the exposed photopatternable deposition inhibitor material; and
  (e) depositing layer of functional material on the substrate by a vapor phase deposition process;
  wherein the functional material is substantially deposited only in the selected areas of the substrate not having the deposition inhibitor material. It should be recognized that any vapor phase deposition method can be used with the photopatternable deposition inhibitor materials.

It is an advantage of the present invention that metal oxides and other materials can be selectively deposited.

It is yet a further advantage of the present invention that it is adaptable for deposition on a web or other moving substrate, including deposition onto a large area substrate.

It is a further advantage of the present invention that it allows operation, in preferred embodiments, under atmospheric pressure conditions.

It is still a further advantage of the present invention that it can be employed in low temperature processes at atmospheric pressures, which process may be practiced in an unsealed environment, open to ambient atmosphere.

The objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

Figure 1A:
FIGS. 1A through 1E show the layers on the substrate at different points in the process in one embodiment of the present invention.

The present invention relates to forming patterned thin films using selective area deposition (SAD). Various methods of vapor phase deposition for depositing the thin films can be used, for example, chemical vapor deposition (CVD) or atomic layer deposition (ALD). Selective area deposition, as noted above involves treating portion(s) of a substrate such that a material is deposited only in those areas that are desired. The present invention employs a photopatternable deposition inhibitor material that inhibits the deposition of the thin films on its surface. In this manner, portions of the substrate where there is a deposition inhibitor material will have little to no thin film growth, and in areas of the substrate which are generally free of the inhibitor material will have normal film growth.

The phrase "deposition inhibitor material" refers herein to the material applied to the substrate as well as the material resulting from any optionally subsequent crosslinking or other reaction that modifies the material that may occur prior to depositing an inorganic thin film on the substrate by a vapor phase deposition process.

The present invention is directed to the use, as a photopatternable deposition inhibitor material, of organosiloxanes and formulations containing organosiloxanes. The organosiloxanes are defined generically to include compounds substantially comprising, within their chemical structure, a skeleton or moiety made up of alternate Si and O atoms, in which at least one, preferably two organic groups are attached to the Si atom on either side of the —O—Si—O— repeat units. The organic groups can have various substituents such as halogens, including fluorine. Most preferably, the organic groups are independently substituted or unsubstituted alkyl, phenyl, or cycloalkyl groups having 1 to 6 carbon atoms, preferably 1 to 3 carbon atoms, preferably substituted or unsubstituted methyl.

Organosiloxane polymers are defined to include polymers, prepolymers, or macromonomers. Particularly preferred are deposition inhibitor materials that, after application onto the substrate, and any crosslinking or intermolecular reaction, are insoluble. Such organosiloxane polymers include random or block and/or crosslinked polymers. Crosslinking can be used to insolubilize the organosiloxane polymer after application onto the surface of the substrate. The crosslinking may occur during patterning in order to contribute to the patterning step, for example, by employing crosslinking initiated by, and patterned by, actinic radiation, followed by removal of non-crosslinked polymer, for example, by solvent.

Optionally, functional groups may be present on the organosiloxane polymer such as terminal groups (also referred to as endcaps). Crosslinking groups, and/or functional groups may also be present, for example, located on a side chain off a siloxane backbone.

Examples or of organosiloxane polymers include, for example, poly(alkylsiloxane), poly(arylsiloxane), poly(alkylarylsiloxane), and poly(alkyl(aryl)siloxane), optionally having functional groups.

Such functionalized poly(siloxanes) include epoxy-functionalized, carboxyl-functionalized, polyether-functionalized, phenol-functionalized, amino-functionalized, alkoxy-functionalized, methacryl-functionalized, carbinol-functionalized, hydroxy-functionalized, vinyl-functionalized, acrylic-functionalized, silane-functionalized, trifluoro-functionalized, or mercapto-functionalized poly(organosiloxanes). Block copolymers can also be employed if at least one of the blocks contains substantial siloxane repeat units. Such polymers can be prepared as described in numerous patents and publications or are commercially available from, for example, General Electric, Dow Corning, and Petrarch.

The preferred poly(organosiloxane) polymers, including random or block copolymers, comprise organic groups (attached to the silicon atoms) that are independently hydrogen, alkyl having from 1 to 18 carbons, such as methyl, ethyl, propyl, butyl, and the like; an aryl group having 6 to 18 carbons, preferably 6 to 8 carbon atoms, such as phenyl, benzyl, napthyl, and the like; a mercaptoalkyl group having from 1 to 18 carbons, such as mercaptopropyl; an aminoalkyl group having from 1 to 18 carbons, such as aminopropyl or aminoisopropyl; trifluoroalkyl having 1 to 18 carbons, such as trifluoromethyl; or trifluoroaryl having 6 to 18 carbons, such as trifluoromethylphenyl. The preferred weight average molecular weight range for the poly(organosiloxane) polymers, if not crosslinked, is 200 to 140,000, more preferably 4,000 to 120,000. Preferably, alkyl groups have 1 to 6 carbon atoms, more preferably 1 to 3 carbon atoms.

Some preferred illustrative poly(organosiloxane) polymers (or substantial portions thereof) are poly(dimethylsiloxane), poly(diphenylsiloxane), poly(methylphenylsiloxane), poly(dimethyldiphenylsiloxane), mercaptopropyl-functionalized poly(dimethylsiloxane), aminopropyl-functionalized poly(dimethylsiloxane), carboxypropyl-functionalized poly(dimethylsiloxane), silane-functionalized poly(dimethylsiloxane), and trifluoropropyl-functionalized poly(dimethylsiloxane). More preferred poly(organosiloxane) polymers are poly(dimethylsiloxane) (PDMS) and poly(dimethyldiphenylsiloxane), that is, where the organic groups are appropriately methyl or phenyl. Mixtures of poly(organosiloxane) polymers or compounds can be used. As indicated below, the organosiloxane can be mixed with other polymers as appropriate to the task.

Organosiloxanes for use in selective area deposition (SAD), unlike other deposition inhibitor materials, can provide near zero growth of the thin film on the inhibitor surface. This property greatly enhances the usefulness of the deposition inhibitor material, since it enables a thin film to be selectively deposited that is of a much greater thickness than those previously capable of being deposited in SAD processes.

In one embodiment of the invention, a patterned thin film is deposited via a vapor phase deposition process, such as ALD, and simultaneously patterned using selective area deposition (SAD) materials and processes. SAD processes use a deposition inhibitor compound in order to inhibit the ALD growth of the thin film in the non-selected areas.

ALD can be used as a fabrication step for forming a number of types of thin-films for electronic devices, including semiconductor devices and supporting electronic components such as resistors and capacitors, insulators, bus lines, and other conductive structures. ALD is particularly suited for forming thin layers of metal oxides in the components of electronic devices. General classes of functional materials that can be deposited with ALD include conductors, dielectrics or insulators, and semiconductors.

Advantageously, ALD steps are self-terminating and can deposit precisely one atomic layer when conducted up to or beyond self-termination exposure times. An atomic layer typically ranges from about 0.1 to about 0.5 molecular monolayers, with typical dimensions on the order of no more than a few Angstroms. In ALD, deposition of an atomic layer is the outcome of a chemical reaction between a reactive molecular precursor and the substrate. In each separate ALD reaction-deposition step, the net reaction deposits the desired atomic layer and substantially eliminates "extra" atoms originally included in the molecular precursor. In its most pure form, ALD involves the adsorption and reaction of each of the precursors in the complete absence of the other precursor or precursors of the reaction. In practice in any process it is difficult to avoid some direct reaction of the different precursors leading to a small amount of chemical vapor deposition reaction. The goal of any process claiming to perform ALD is to obtain device performance and attributes commensurate with an ALD process while recognizing that a small amount of CVD reaction can be tolerated.

In ALD applications, typically two molecular precursors are introduced into the ALD reactor in separate stages. For example, a metal precursor molecule, $ML_x$, comprises a metal element, M that is bonded to an atomic or molecular ligand, L. For example, M could be, but would not be restricted to, Al, W, Ta, Si, Zn, etc. The metal precursor reacts with the substrate when the substrate surface is prepared to react directly with the molecular precursor. For example, the substrate surface typically is prepared to include hydrogen-containing ligands, AH or the like, that are reactive with the metal precursor. Sulfur (S), oxygen (O), and Nitrogen (N) are some typical A species. The gaseous precursor molecule effectively reacts with all of the ligands on the substrate surface, resulting in deposition of a single atomic layer of the metal:

substrate–$AH+ML_x \rightarrow$ substrate–$AML_{x-1}+HL$ (1)

where HL is a reaction by-product. During the reaction, the initial surface ligands, AH, are consumed, and the surface becomes covered with $AML_{x-1}$ ligands, which cannot further react with metal precursor $ML_x$. Therefore, the reaction self-terminates when all of the initial AH ligands on the surface are replaced with $AML_{x-1}$ species. The reaction stage is typically followed by an inert-gas purge stage that eliminates the excess metal precursor and the HL by-product species from the chamber prior to the separate introduction of the other precursor.

A second molecular precursor then is used to restore the surface reactivity of the substrate towards the metal precursor. This is done, for example, by removing the L ligands and re-depositing AH ligands. In this case, the second precursor typically comprises the desired (usually nonmetallic) element A (i.e., O, N, S), and hydrogen (i.e., $H_2O$, $NH_3$, $H_2S$). The next reaction is as follows:

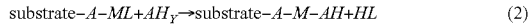
substrate–$A-ML+AH_Y \rightarrow$ substrate–$A-M-AH+HL$ (2)

This converts the surface back to its AH-covered state. (Here, for the sake of simplicity, the chemical reactions are not balanced.) The desired additional element, A, is incorporated into the film and the undesired ligands, L, are eliminated as volatile by-products. Once again, the reaction consumes the reactive sites (this time, the L terminated sites) and self-terminates when the reactive sites on the substrate are entirely depleted. The second molecular precursor then is removed from the deposition chamber by flowing inert purge-gas in a second purge stage.

In summary, then, an ALD process requires alternating in sequence the flux of chemicals to the substrate. The representative ALD process, as discussed above, is a cycle having four different operational stages:

1. $ML_x$ reaction;
2. $ML_x$ purge;
3. $AH_y$ reaction; and
4. $AH_y$ purge, and then back to stage 1.

This repeated sequence of alternating surface reactions and precursor-removal that restores the substrate surface to its initial reactive state, with intervening purge operations, is a typical ALD deposition cycle. A key feature of ALD operation is the restoration of the substrate to its initial surface chemistry condition. Using this repeated set of steps, a film can be layered onto the substrate in equal metered layers that are all identical in chemical kinetics, deposition per cycle, composition, and thickness.

Self-saturating surface reactions make ALD insensitive to transport non-uniformities, which might otherwise impair surface uniformity, due either to engineering tolerances and the limitations of the flow process or related to surface topography (that is, deposition into three dimensional, high aspect ratio structures). As a general rule, a non-uniform flux of chemicals in a reactive process generally results in different completion times at different areas. However, with ALD, each of the reactions is allowed to complete on the entire substrate surface. Thus, differences in completion kinetics impose no penalty on uniformity. This is because the areas that are first to complete the reaction self-terminate the reaction; other areas are able to continue until the film treated surface undergoes the intended reaction.

Typically, an ALD process deposits about 0.1-0.2 nm of a film in a single ALD cycle (with numbered steps 1 through 4 as listed earlier). A useful and economically feasible cycle time must be achieved in order to provide a uniform film thickness in a range of from about 3 nm to 300 nm for many or most semiconductor applications, and even thicker films for other applications. Industry throughput standards dictate that substrates be processed in 2 minutes to 3 minutes, which means that ALD cycle times must be in a range from about 0.6 seconds to about 6 seconds.

An ALD process must be able to execute this sequencing efficiently and reliably for many cycles in order to allow cost-effective coating of many substrates. In an effort to minimize the time that an ALD reaction needs to reach self-termination, at any given reaction temperature, one approach has been to maximize the flux of chemicals flowing into the ALD reactor, using a so-called "pulsing" process. In the pulsed ALD process, a substrate sits in a chamber and is exposed to the above sequence of gases by allowing a first gas to enter the chamber, followed by a pumping cycle to remove that gas, followed by the introduction of a second gas to the chamber, followed by a pumping cycle to remove the second gas. This sequence can be repeated at any frequency and variations in gas type and/or concentration. The net effect is that the entire chamber experiences a variation in gas composition with time, and thus this type of ALD can be referred to as time dependent ALD. The vast majority of existing ALD processes are time dependent ALD.

In order to overcome inherent limitations of time dependent ALD systems, each reactant gas can be provided continuously while moving the substrate through each gas in succession. In these systems a relatively constant gas composition exists, but is located to specific areas or spaces of the processing system. These systems can be referred to as spatially dependent ALD systems.

For example, U.S. Pat. No. 6,821,563 entitled "GAS DISTRIBUTION SYSTEM FOR CYCLICAL LAYER DEPOSITION" to Yudovsky describes a spatially dependent ALD processing system, under vacuum, having separate gas ports for precursor and purge gases, alternating with vacuum pump ports between each gas port. Each gas port directs its stream of gas vertically downward toward a substrate. Walls or partitions separate the gas flows, with vacuum pumps for evacuating gas on both sides of each gas stream. Another approach using continuous gas flow spatially dependent ALD is shown in U.S. Pat. No. 4,413,022 entitled "METHOD FOR PERFORMING GROWTH OF COMPOUND THIN FILMS" to Suntola et al. A gas flow array is provided with alternating source gas openings, carrier gas openings, and vacuum exhaust openings. Reciprocating motion of the substrate over the array effects ALD deposition, without the need for pulsed operation.

U.S. Patent Publication No. 2005/0084610 to Selitser discloses an atmospheric pressure atomic layer chemical vapor deposition process. Selitser states that extraordinary increases in reaction rates are obtained by changing the operating pressure to atmospheric pressure, which will involve orders of magnitude increase in the concentration of reactants, with consequent enhancement of surface reactant rates.

A spatially dependent ALD process can be accomplished with other apparatus or systems described in more detail in commonly assigned US Patent Publication No. 2007/0238311; US Patent Publication No. 2007/0228470; U.S. patent application Ser. No. 11/620,740; and U.S. patent application Ser. No. 11/620,744. All these identified applications hereby incorporated by reference in their entirety. These systems attempt to overcome one of the difficult aspects of a spatial ALD system, which is undesired intermixing of the continuously flowing mutually reactive gases. In particular, US Patent Publication No. 2007/0238311 employs a novel transverse flow pattern to prevent intermixing, while U.S. patent application Ser. Nos. 11/620,744 and 11/620,740 employ a coating head partially levitated by the pressure of the reactive gases of the process to accomplish improved gas separation.

Although ALD is a preferred method of depositing a layer of functional material, other conventional methods of vapor phase deposition can be used, as will be appreciated by the skilled artisan.

Figure 1B:
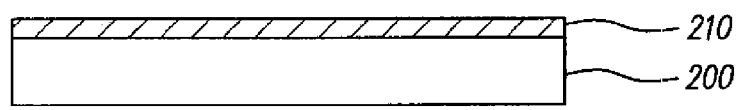
Figure 1C:
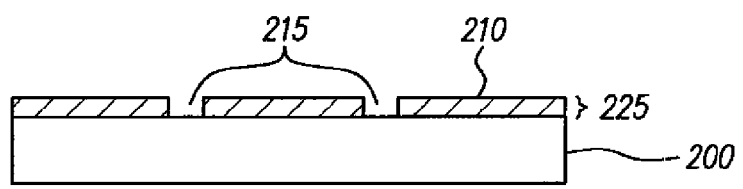
Figure 1D:
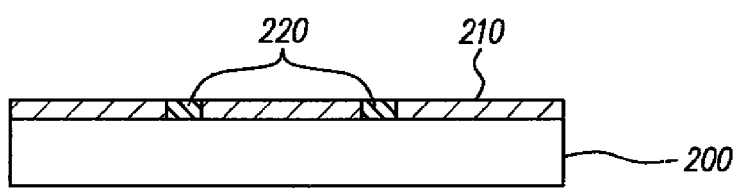
Figure 1E:
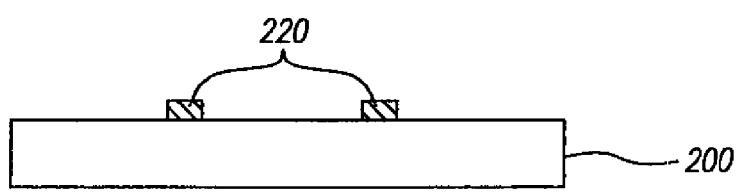

The present process can be better understood with reference to FIGS. 1A through 1E. FIG. 1A shows a substrate 200 prior to the application of the deposition inhibitor material 210. Although the substrate 200 is illustrated as a bare substrate, one skilled in the art should recognize that substrate 200 might contain layers of materials, either patterned or unpatterned, to serve any purpose electrical, optical, or mechanical, as desired. FIG. 1B shows a substrate 200 after a uniform deposition of deposition inhibitor material 210. FIG. 1C illustrates substrate 200 after the step of patterning the deposition inhibitor material 210 into deposition mask 225. The patterning can be done by any method known in the art, including photolithography using either positive or negative acting photoresists, laser ablation, or other subtractive processes. As shown, deposition mask 225 contains areas of deposition inhibitor material 210 and areas devoid of deposition inhibitor 215. FIG. 1D illustrates substrate 200 after the step of atomic layer deposition of the desired thin film material. As shown, thin film material 220 is only deposited on the substrate 200 where there was no deposition inhibitor material 210. The thin film material 220 does not form any appreciable thin film over deposition inhibitor material 210. FIG. 1E illustrates a patterned thin film material 220 after removing the deposition inhibitor material 210. It should be understood by one skilled in the art, that in some instances it would not be necessary to remove the deposition inhibitor material 210.

Figure 2:
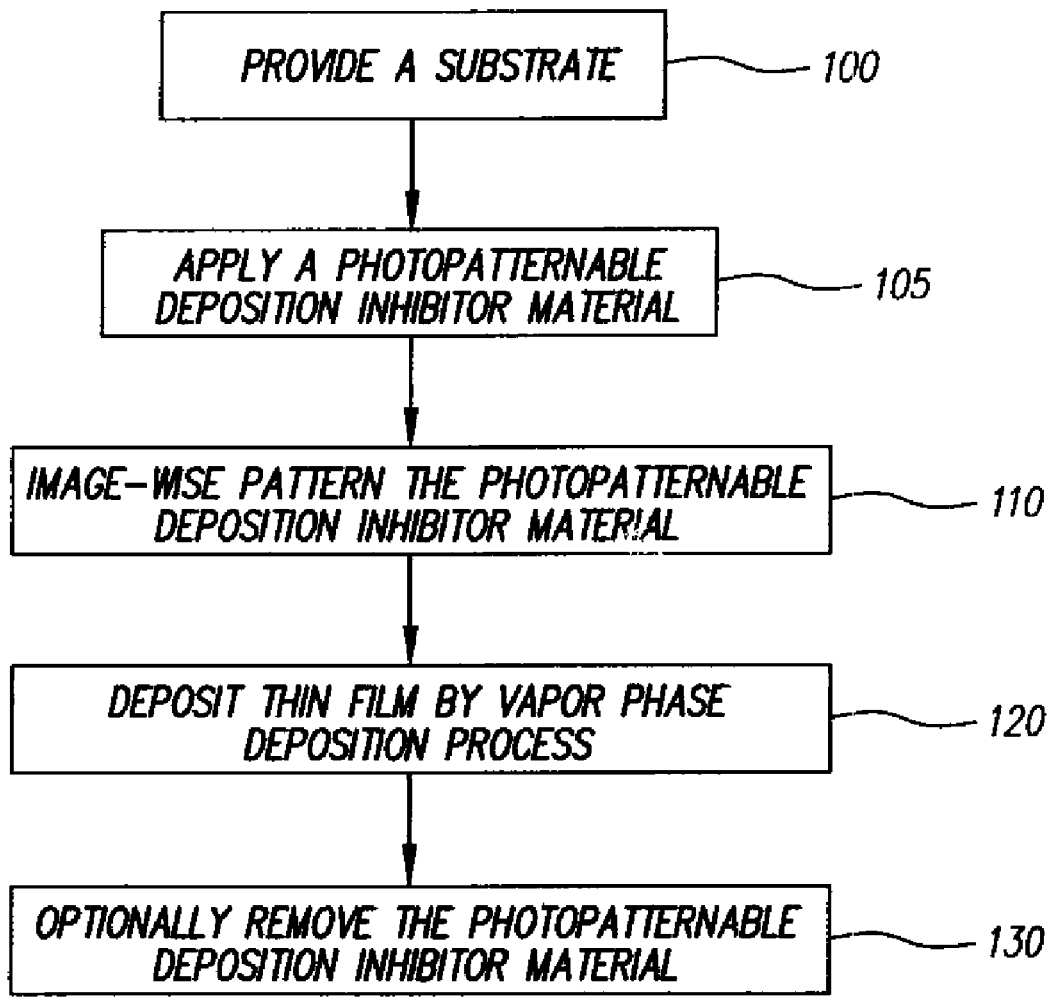
FIG. 2 is a flow chart describing one embodiment of the steps of the present process.

FIG. 2 is a step diagram for one embodiment of a process of the present invention for making a patterned thin film using a combination of selected area deposition (SAD) and ALD. As shown in Step 100, a substrate is supplied into the system. In Step 105 a photopatternable deposition inhibitor material is deposited. The photopatternable deposition inhibitor material can generically be any material that causes the material deposition to be inhibited which can be patterned using light. In one embodiment, the photopatternable deposition inhibitor material is chosen specifically for the material to be deposited. In other embodiments, the deposition inhibitor material has a given inhibition power; the inhibition power is defined as the layer thickness at or below which the deposition inhibitor material is effective. In further embodiments the photopatternable deposition inhibitor material is chosen to be sensitive only to selected wavelengths of visible light. Step 105 deposits a uniform layer of the photopatternable deposition inhibitor material and Step 110 is employed to form a patterned layer of the deposition inhibitor material. Step 110 comprises the step of exposing the photopatternable deposition inhibitor material to a pattern of light. The exposing can be done using a large source through a traditional mask or color mask, alternatively, the photopatternable deposition inhibitor material may be exposed using a laser marking system. For mask exposure, the mask may be in contact with substrate or focused through a lens to the substrate. A mask exposure may be done a single time for an entire substrate, or the mask may be stepped over the substrate to achieve several exposures. Step 110 also includes the step of developing the photopatternable deposition inhibitor material such that substrate has areas where there is no deposition inhibitor material and areas where the deposition inhibitor material remains.

Continuing with FIG. 2, Step 120 deposits the desired thin film by a vapor phase deposition process. In a preferred embodiment, the vapor phase deposition process is an Atomic Layer Deposition (ALD) process. Generically this deposition can use any suitable ALD equipment, preferably with a spatially dependent ALD system. The thin film is deposited only in the areas of the substrate where there is no deposition inhibitor material. Depending on the use of the thin film, the deposition inhibitor material may remain on the substrate for subsequent processing or may be removed as shown in Step 130 of FIG. 2.

The present invention utilizes a photopatternable deposition inhibitor material that contains an organosiloxane. In order to be patternable by long UV or visible light the photopatternable deposition inhibitor also contains a sensitizer.

The deposition inhibitor material of the present invention preferably has an effective inhibition power, defined as the functional layer thickness at or below which the deposition inhibitor material is effective. Preferably, the deposition inhibitor material, during use, exhibits an inhibition power of at least 50 Å, more preferably at least 100 Å, most preferably at least 300 Å.

The organosiloxane can be crosslinked or photopolymerized after being applied. Crosslinking can be used to insolubilize a polymeric deposition inhibitor material after application onto the surface of the substrate. The crosslinking can occur during patterning in order to contribute to the patterning step, for example, by employing crosslinking initiated by, and patterned by, exposing the photopatternable deposition inhibitor, followed by removal of non-crosslinked polymer, for example, by solvent.

The deposition inhibitor material, in addition to the organosiloxane also contains a photopatternable material, for example, a photopolymerizable or photosolubilizable (or "photosolulizable") material, in combination with a sensitizing system, the combination referred to as a photopolymerization system, which can be blended with organosiloxane to obtain the deposition inhibitor material.

A variety of photopolymerization systems that can be used in the present process, which are activated by visible or non-visible radiation, are known. A useful discussion of UV curable and visible light photopatternable materials can be found in "Photoreactive Polymers: The Science and Technology of Resists" by A. Reiser, Wiley-Interscience, John Wiley & Sons, 1989, pp. 102-129. Farid U.S. Pat. No. 4,859,572, incorporated here by reference, describes a photopatternable material used in a photographic imaging system, which relies on using visible light to harden an organic component and produce an imaged pattern. This reference also describes a variety of suitable visible light sensitive photoinitiators, monomers, and film formulation guidelines for use in the curable layers which can be used in the present process in combination with the organsiloxane.

The sensitizing system for the photopolymerization system, for providing sensitivity to visible light, can be accomplished by the use of, along with a polymerizable compound, a photopolymerization initiator. In a preferred embodiment of the invention, the photopatternable material for the photopatternable deposition inhibitor material contains a polymerizable compound selected from among compounds having at least one, preferably two or more, ethylenically unsaturated bonds. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above-unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, etc. As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerytritol trimethacrylate, pentaerythritol tetramethacrylate, dipentaerythritol dimethacrylate, dipentaerythritol hexamethacrylate, sorbitol trimethacrylate, sorbitol tetramethacrylate, and bis[p-(3-methacryloxy-2-hydroxy-propoxy)phenyl]dimethylmethane, bis[p-(methacryloxyethoxy)-phenyl]dimethylmethane. As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. As crotonates, examples include ethylene glycol dicrotonate, tetramethylene glycol dicrotonate, pentaerythritol dicrotonate, and sorbitol tetradicrotonate. As isocrotonates, examples include ethylene glycol diisocrotonate, pentaerythritol diisocrotonate, and sorbitol tetraisocrotonate. As maleates, examples include ethylene glycol dimaleate, triethylene glycol dimaleate, pentaerythritol dimaleate, and sorbitol tetramaleate. Further, the mixtures of the above-described ester monomers can also be used. Further, specific examples of amide monomers of aliphatic polyhydric amine compounds and unsaturated carboxylic acids include methylenebis acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, and xylylenebis-methacrylamide.

Further, urethane-based addition polymerizable compounds which are obtained by the addition reaction of an isocyanate and a hydroxyl group can also be used in the photopatternable material for the photopatternable deposition inhibitor material. A specific example is a vinyl urethane compound having two or more polymerizable vinyl groups in one molecule, which is obtained by the addition of a vinyl monomer having a hydroxyl group represented by the following formula (V) to a polyisocyanate compound having two or more isocyanate groups in one molecule.

wherein R and R' each represents H or $CH_3$.

Other examples include polyfunctional acrylates and methacrylates, such as polyester acrylates, and epoxy acrylates obtained by reacting epoxy resins with (meth)acrylic acids. Moreover, photo-curable monomers and oligomers listed in Sartomer Product Catalog by Sartomer Company Inc. (1999) can be used as well.

Depending upon the final design characteristics of the photopatternable deposition inhibitor material, a suitable addition polymerizable compound or combination of addition polymerizable compounds, having the desired structure and amounts can be used. For example, the conditions are selected from the following viewpoint. For the photosensitive speed, a structure containing many unsaturated groups per molecule is preferred and in many cases bifunctional or more functional groups are preferred. For increasing the strength of an image part, i.e., a cured film, trifunctional or more functional groups are preferred. It is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but may not be preferred from the point of development speed and precipitation in a developing solution. The selection and usage of the addition polymerizable compound are important factors for compatibility with other components in the photopatternable deposition inhibitor material (e.g., the organosiloxane, any additional binder polymer, an initiator, etc.) and incompatibility with a subsequently applied functional material. For example, sometimes compatibility can be improved by using a low purity compound or two or more compounds in combination. Further, it is also possible to select a compound having specific structure for the purpose of improving the adhesion property to the support. Concerning the compounding ratio of the addition polymerizable compound in a photopolymerization composition, the higher the amount, the higher the sensitivity. But, too large an amount sometimes results in disadvantageous phase separation, problems in the manufacturing process due to the stickiness of the photopolymerization composition (e.g., manufacturing failure resulting from the transfer and adhesion of the photosensitive material components), and precipitation from a developing solution. The addition-polymerizable compound may be used alone or in combination of two or more. In addition, appropriate structure, compounding ratio and addition amount of the addition-polymerizable compound can be arbitrarily selected taking into consideration the degree of polymerization hindrance due to oxygen, resolving power, fogging characteristic, refractive index variation and surface adhesion.

Organic polymeric binders which can optionally form a part of the film forming component of the photopatternable layer include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having average weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation such as polymerized forms of any of the various ethylenically unsaturated monomers, such as polyalkylenes—e.g. polyethylene and polypropylene; polyvinyl alcohol); polystyrene; poly(acrylic and methacrylic acids and esters)—e.g. poly(methyl methacrylate) and poly(ethyl acrylate), as well as copolymer variants. The polymerizable compound and the polymeric binder can be employed together in widely varying proportions, including polymerizable compound ranging from 3-97 percent by weight of the film forming component and polymeric binder ranging from 97-3 percent by weight of the film forming component. A separate polymeric binder, although preferred, is not an essential part of the photopatternable film and is most commonly omitted when the polymerizable compound is itself a polymer.

Various photoinitiators can be selected for use in the above-described photopatternable deposition inhibitor material. Preferred photoinitators consist of an organic dye.

The amount of organic dye to be used is preferably in the range of from 0.1 to 5% by weight based on the total weight of the photopolymerization composition, preferably from 0.2 to 3% by weight.

The organic dyes for use as photoinitiators may be suitably selected from conventionally known compounds having a maximum absorption wavelength falling within a range of 300 to 1000 nm. High sensitivity can be achieved by selecting a desired dye having a desired absorption spectrum. Also, it is possible to suitably select a light source such as blue, green, or red, or infrared LED (light emitting diode), solid state laser, OLED (organic light emitting diode) or laser, or the like for use in image-wise exposure to light.

Specific examples of the photoinitiator organic dyes include 3-ketocoumarin compounds, thiopyrylium salts, naphthothiazolemerocyanine compounds, merocyanine compounds, and merocyanine dyes containing thiobarbituric acid, hemioxanole dyes, and cyanine, hemicyanine, and merocyanine dyes having indolenine nuclei. Other examples of the organic dyes include the dyes described in Chemistry of Functional Dyes (1981, CMC Publishing Co., Ltd., pp. 393-416) and Coloring Materials (60 [4], 212-224, 1987). Specific examples of these organic dyes include cationic methine dyes, cationic carbonium dyes, cationic quinoimine dyes, cationic indoline dyes, and cationic styryl dyes. Examples of the above-mentioned dyes include keto dyes such as coumarin dyes (including ketocoumarin and sulfonocoumarin), merostyryl dyes, oxonol dyes, and hemioxonot dyes; nonketo dyes such as nonketopolymethine dyes, triarylmethane dyes, xanthene dyes, anthracene dyes, rhodamine dyes, acridine dyes, aniline dyes, and azo dyes; nonketopolymethine dyes such as azomethine dyes, cyanine dyes, carbocyanine dyes, dicarbocyanine dyes, tricarbocyanine dyes, hemicyanine dyes, and styryl dyes; quinoneimine dyes such as azine dyes, oxazine dyes, thiazine dyes, quinoline dyes, and thiazole dyes.

Preferably, the photoinitiator organic dye is a cationic dye-borate anion complex formed from a cationic dye and an anionic organic borate. The cationic dye absorbs light having a maximum absorption wavelength falling within a range from 300 to 1000 nm and the anionic borate has four R groups, of which three R groups each represents an aryl group which may have a substitute, and one R group is an alkyl group, or a substituted alkyl group. Such cationic dye-borate anion complexes have been disclosed in U.S. Pat. Nos. 5,112,752; 5,100,755; 5,057,393; 4,865,942; 4,842,980; 4,800,149; 4,772,530; and 4,772,541, which are incorporated herein by reference.

When the cationic dye-borate anion complex is used as the organic dye in the photopolymerization compositions of the invention, it does not require to use the organoborate salt. However, to increase the photopolymerization sensitivity, it is preferred to use an organoborate salt in combination with the cationic dye-borate complex. The organic dye can be used singly or in combination.

Specific examples of the above-mentioned cationic dye-borate salts are given below. However, it should be noted that the present invention is not limited to these examples.

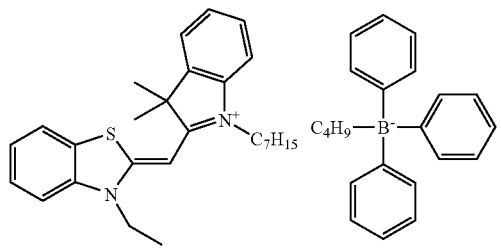

Dye-1

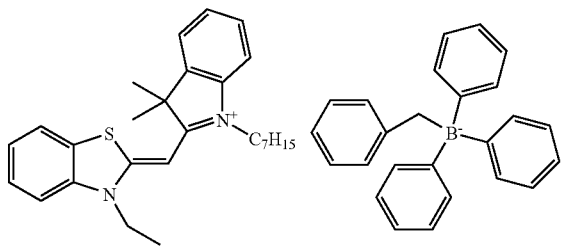

Dye-2

-continued
Dye-3
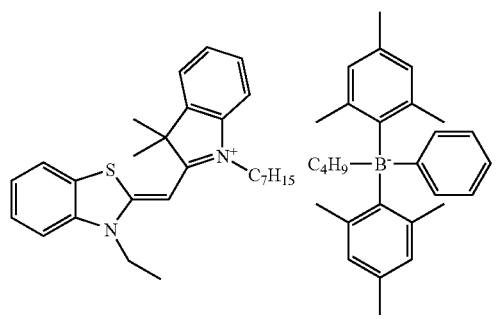
Dye-4
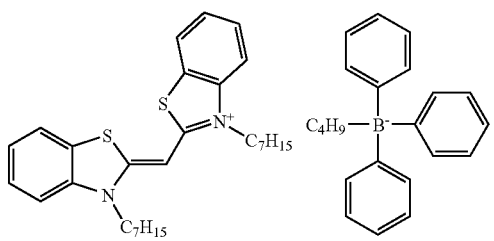
Dye-5
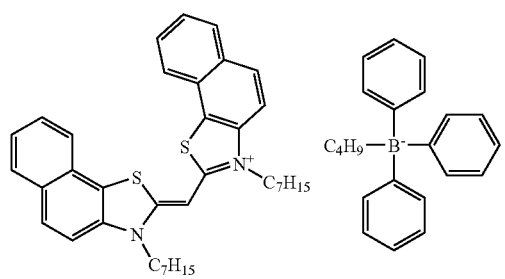
Dye-6
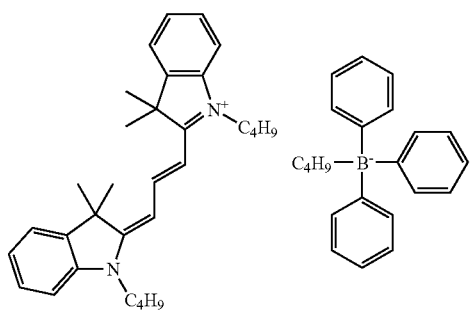
Dye-7
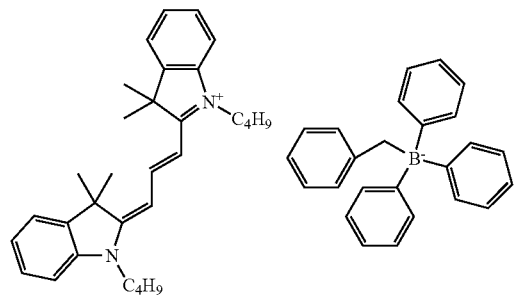
Dye-8
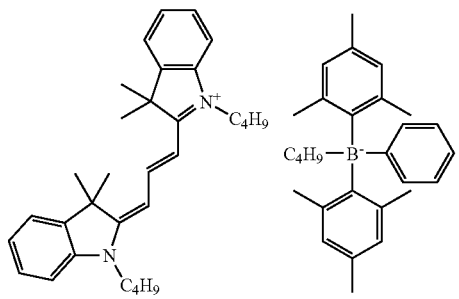
Dye-9
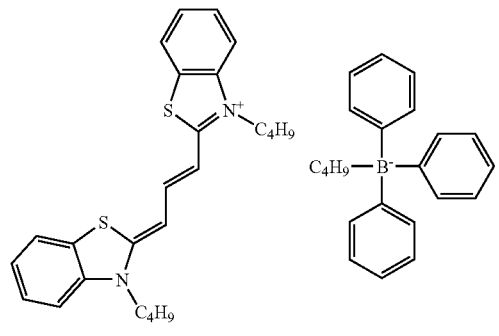
Dye-10
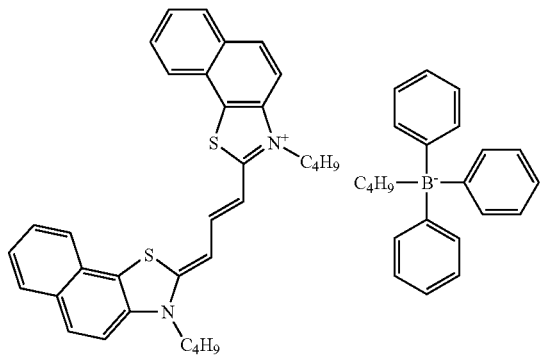

-continued
Dye-11
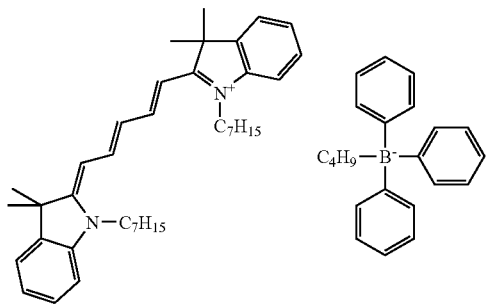
Dye-12
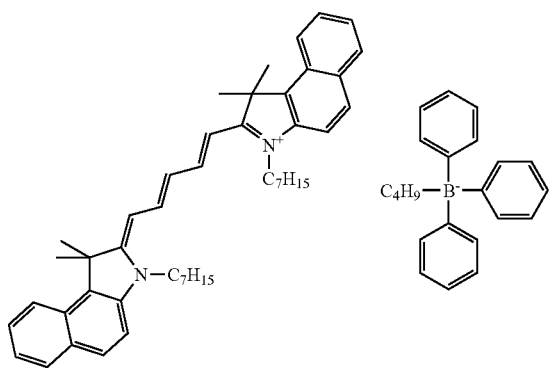
Dye-13
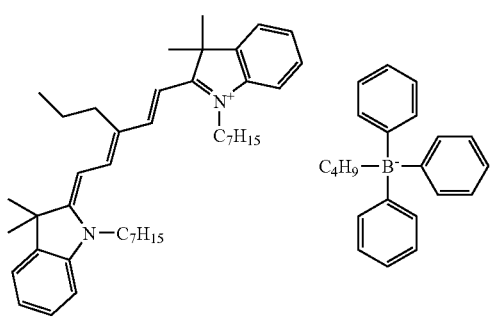
Dye-14
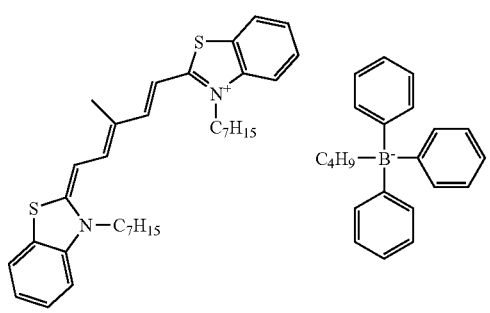
Dye-15
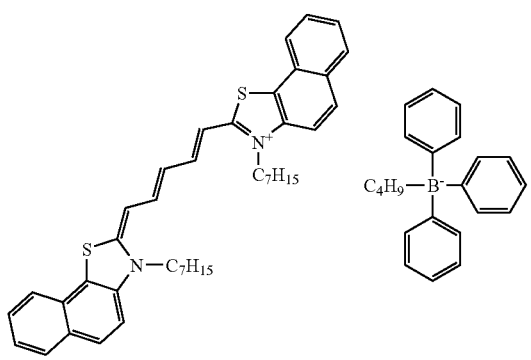
Dye-16
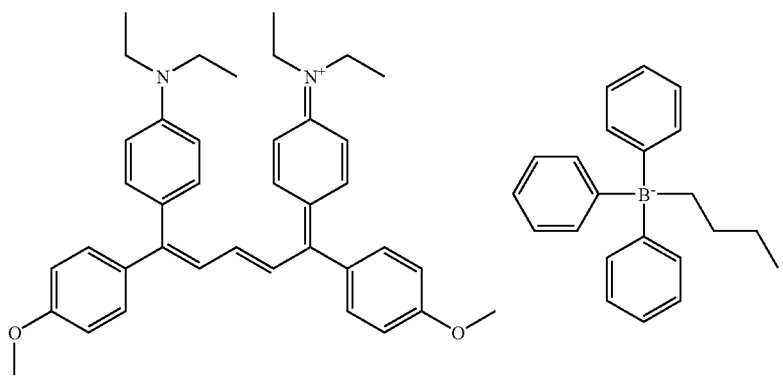

-continued

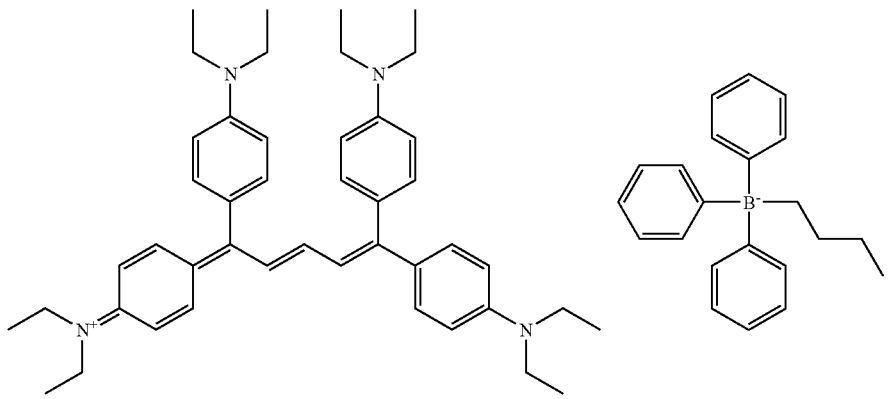

Dye-17

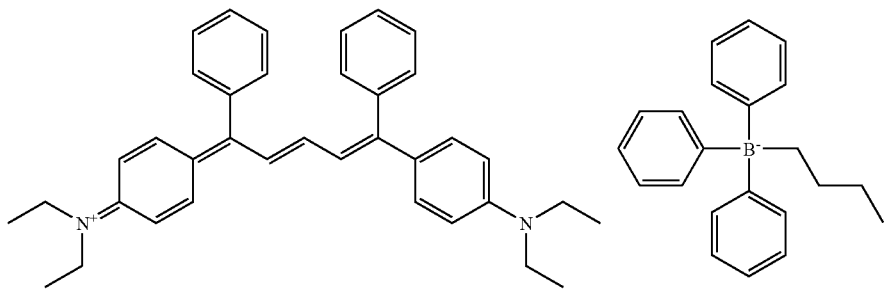

Dye-18

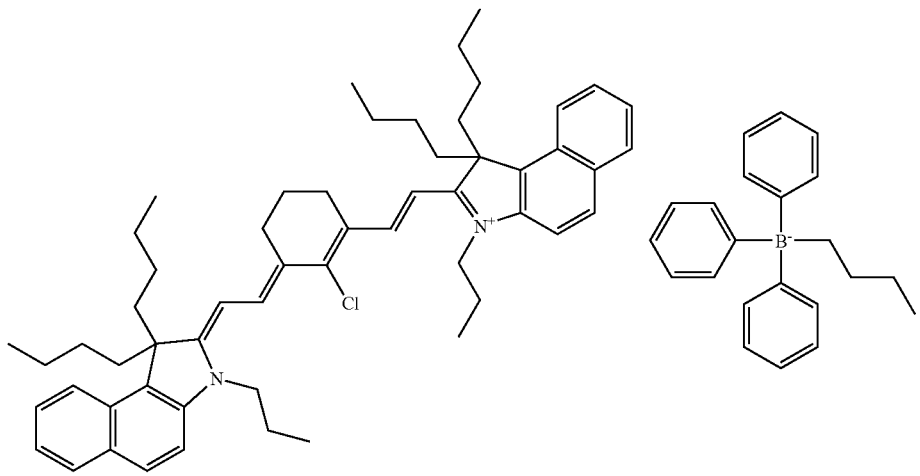

Dye-19

It may be preferable to use the photoinitiator in combination with an organic borate salt such as disclosed in U.S. Pat. Nos. 5,112,752; 5,100,755; 5,057,393; 4,865,942; 4,842,980; 4,800,149; 4,772,530 and 4,772,541. If used, the amount of borate compound contained in the photopolymerization composition of the invention is preferably from 0% to 20% by weight based on the total amount of photopolymerization composition. The borate salt useful for the photosensitive composition of the present invention is represented by the following general formula (I).

$[BR_4]^- Z^+$ where Z represents a group capable of forming cation and is not light sensitive, and $[BR4]^-$ is a borate compound having four R groups which are selected from an alkyl group, a substituted alkyl group, an aryl group, a substituted aryl group, an aralkyl group, a substituted aralkyl group, an alkaryl group, a substituted alkaryl group, an alkenyl group, a substituted alkenyl group, an alkynyl group, a substituted alkenyl group, an alicyclic group, a substituted alicyclic group, a heterocyclic group, a substituted heterocyclic group, and a derivative thereof. Plural Rs may be the same as or different from each other. In addition, two or more of these groups may join together directly or via a substituent and form a boron-containing heterocycle. Z+ does not absorb light and represents an alkali metal, quaternary ammonium, pyridinium, quinolinium, diazonium, morpholinium, tetrazolium, acridinium, phosphonium, sulfonium, oxosulfonium, iodonium, S, P, Cu, Ag, Hg, Pd, Fe, Co, Sn, Mo, Cr, Ni, As, or Se.

Specific examples of the abovementioned borate salts are given below. However, it should be noted that the present invention is not limited to these examples.
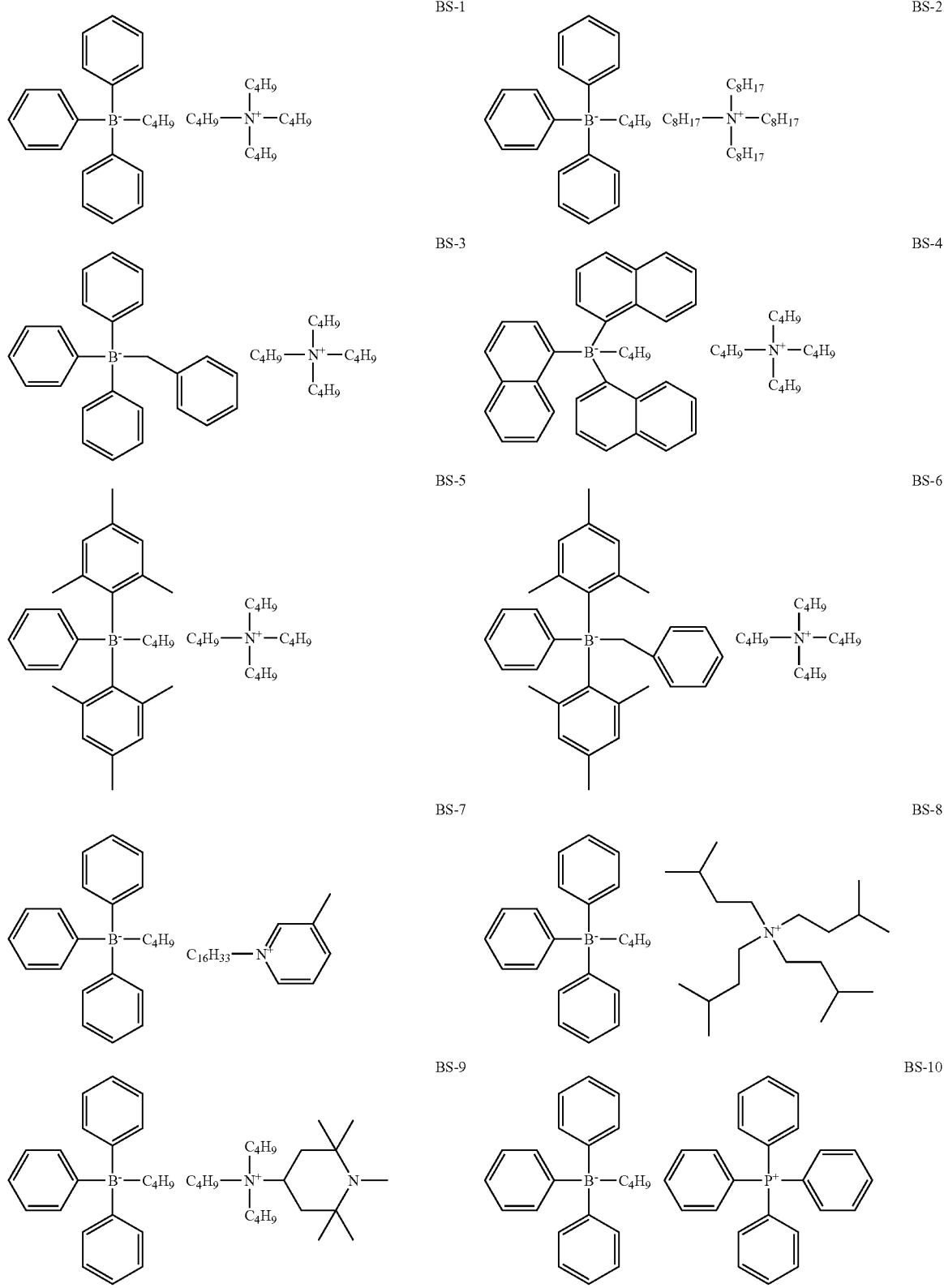

-continued

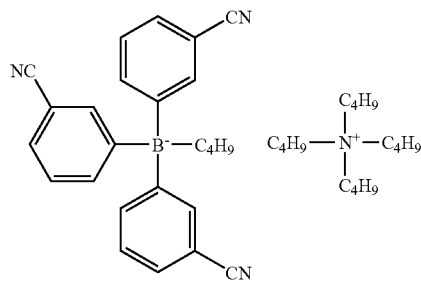
BS-11

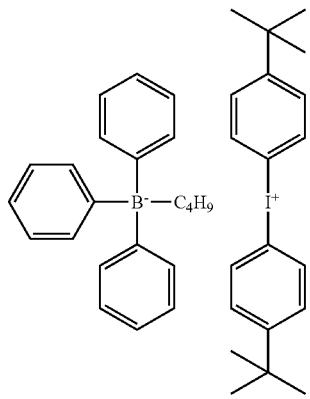
BS-12

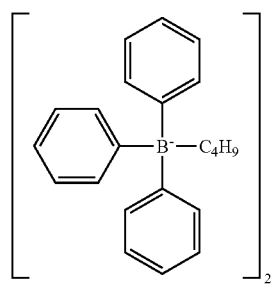
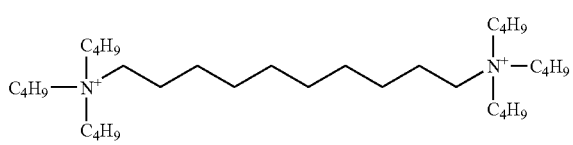
BS-13

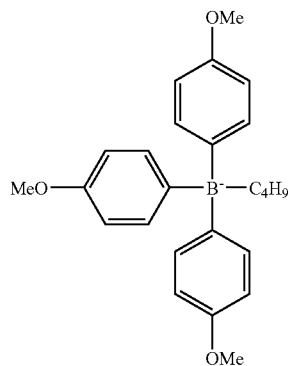
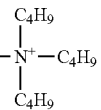
BS-14

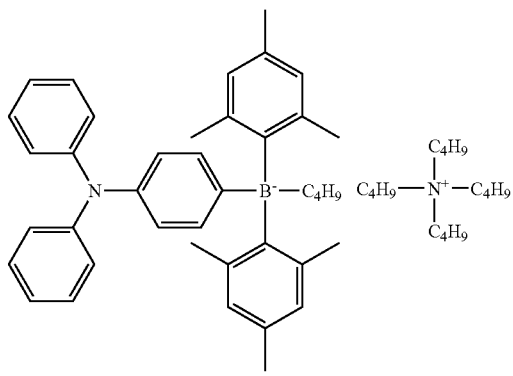
BS-15

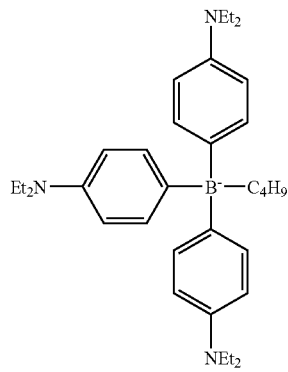
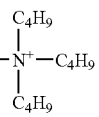
BS-16

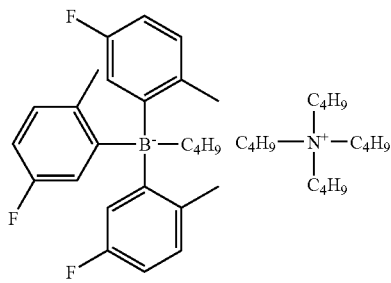
BS-17

Various additives can be used together with the photoinitiator system to affect the polymerization rate of the photopatternable deposition inhibitor material. For example, a reducing agent such as an oxygen scavenger or a chain-transfer aid of an active hydrogen donor, or other compound can be used to accelerate the polymerization. An oxygen scavenger is also known as an autoxidizer and is capable of consuming oxygen in a free radical chain process. Examples of useful autoxidizers are N,N-dialkylanilines. Examples of preferred N,N-dialkylanilines are dialkylanilines substituted in one or more of the ortho-, meta-, or para-position by the following groups: methyl, ethyl, isopropyl, t-butyl, 3,4-tetramethylene, phenyl, trifluoromethyl, acetyl, ethoxycarbonyl, carboxy, carboxylate, trimethylsilymethyl, trimethylsilyl, triethylsilyl, trimethylgermanyl, triethylgermanyl, trimethylstannyl, triethylstannyl, n-butoxy, n-pentyloxy, phenoxy, hydroxy, acetyl-oxy, methylthio, ethylthio, isopropylthio, thio-(mercapto-), acetylthio, fluoro, chloro, bromo and iodo. Representative examples of N,N-dialkylanilines useful in the present invention are 4-cyano-N,N-dimethylaniline, 4-acetyl-N,N-dimethylaniline, 4-bromo-NN-dimethylaniline, ethyl 4-(N,N-dimethylamino)benzoate, 3-chloro-N,N-dimethylaniline, 4-chloro-N,N-dimethylaniline, 3-ethoxy-N,N-dimethylaniline, 4-fluoro-N,N-dimethylaniline, 4-methyl-N,N-dimethylaniline, 4-ethoxy-N,N-dimethylaniline, N,N-dimethylaniline, N,N-dimethylthioanicidine 4-amino-N,N-dimethylaniline, 3-hydroxy-N,N-dimethylaniline, N,N,N',N'-tetramethyl-1,4-dianiline, 4-acetamido-N,N-dimethylaniline, 2,6-diisopropyl-N,N-dimethylaniline (DIDMA), 2,6-diethyl-N,N-dimethylaniline, N,N,2,4,6-pentamethylaniline (PMA) and p-t-butyl-N,N-dimethylaniline.

It may be preferable to use the photoinitiator in combination with a disulfide coinitiator. Examples of useful disulfides are described in U.S. Pat. No. 5,230,982 by Davis et al. which is incorporated herein by reference. Two of the most preferred disulfides are mercaptobenzothiazo-2-yl disulfide and 6-ethoxymercaptobenzothiazol-2-yl disulfide. In addition, thiols, thioketones, trihalomethyl compounds, lophine dimer compounds, iodonium salts, sulfonium salts, azinium salts, organic peroxides, and azides, are examples of compounds useful as polymerization accelerators.

Other additives which can be incorporated into the photopatternable coatings include polymeric binders, fillers, pigments, surfactants, adhesion modifiers, and the like. To facilitate coating on the support and functional layers the light curable film composition is usually dispersed in a solvent to create a solution or slurry, and then the liquid is evaporatively removed, usually with heating, after coating. Any solvent can be employed for this purpose which is inert toward the film forming components and addenda of the light curable film.

It may be preferable to practice the present process with positive-working photopatternable materials in the photopatternable deposition inhibitor material. By way of example, U.S. Pat. No. 4,708,925 by Newman (hereby incorporated by reference) describes a positive-working photopatternable composition containing novolak phenolic resins, an onium salt, and a dye sensitizer. In this system, there is an interaction between alkali-soluble phenolic resins and onium salts which results in an alkali solvent resistance when it is cast into a film. Photolytic decomposition of the onium salt restores solubility to the resin. Unlike the quinine diazides which can only be poorly sensitized, if at all, onium salts can be readily sensitized to a wide range of the electromagnetic spectrum from UV to infrared (280 to 1100 nm).

Examples of compounds which are known to sensitize onium salts are those in the following classes: diphenylmethane including substituted diphenylmethane, xanthene, acridine, methine and polymethine (including oxonol, cyanine, and merocyanine) dye, thiazole, thiazine, azine, aminoketone, porphyrin, colored aromatic polycyclic hydrocarbon, p-substituted aminostyryl compound, aminotriazyl methane, polyarylene, polyarylpolyene, 2,5-diphenylisobenzofuran, 2,5-diarylcyclopentadiene, diarylfuran, diarylthiofuran, diarylpyrrole, polyaryl-phenylene, coumarin and polyaryl-2-pyrazoline. The addition of a sensitizer to the system renders it sensitive to any radiation falling within the absorption spectrum of the said sensitizer. Other positive-working systems are known to those skilled in the art.

In a preferred embodiment of the present process, a mixtures of organosiloxane with a photopolymerizable matrix activated by long UV or visible radiation are preferable photopatternable deposition inhibitor materials. Blends of organosiloxanes with cyclized rubber (poly cis-isoprene), sensitized to UV radiation with a bis-azide (such as 2,6-bis(4-azidobenzal)-4-methylcyclohexanone), are particularly preferred photopatternable compositions for use with the present invention. These formulations may optionally be sensitized to visible wavelengths in accordance with the present invention. The sensitization of poly cis-isoprene resists to visible wavelengths has been described, for example, by J. Frejlich and R. Knoesel (Applied Optics, 18 8 1135-1136 (1979) using triplet sensitizers such as 9-fluorenone).

A layer of photopatternable deposition inhibitor material may be exposed using any convenient method. The layer may be exposed using a photomask or may be laser-exposed without a photomask. The important aspect of the exposure step is that a light pattern containing appropriate wavelength actinic radiation is provided to the photopatternable deposition inhibitor layer so that desired regions are sufficiently exposed for the photopatternable deposition inhibitor material to transition from soluble to insoluble, or vise versa, while other regions remain in the original as-coated state.

Once a photopatternable deposition inhibitor layer is exposed, it can be developed by any means known the art. For example, development can involve removing the soluble portions of photopatternable deposition inhibitor layer. Methods for developing typically include exposure to a selective solvent, heating, or combinations thereof. A liquid developer can be any convenient liquid that is capable of selectively removing the light curable layer in uncured areas. The exposed photopatternable layer can be sprayed, flushed, swabbed, soaked, sonicated, or otherwise treated to achieve selective removal. In its simplest form the liquid developer can be the same liquid employed as a solvent in coating the photopatternable deposition inhibitor material. In some instances the photopatternable deposition inhibitor material is not rendered soluble where it is ultimately to be removed, but is instead rendered susceptible to a particular reaction that occurs during exposure to a development solution which then permits solubility.

In patterning processes where the photopatterned deposition inhibitor layer is not intended to be part of the final article, it needs to be removed after it has been used to successfully pattern an area. This removal can be accomplished with any means known in the art, included plasma treatments, especially plasmas including oxygen, solvent based stripping, and mechanical or dehesive means.

The process of making the patterned thin film in the present process can be carried out below a maximum support temperature of about 300° C., more preferably below 250° C., or even at temperatures around room temperature (about 25° C. to 70° C.). The temperature selection generally depends on the support and processing parameters known in the art, once one is armed with the knowledge of the present invention contained herein. These temperatures are well below traditional integrated circuit and semiconductor processing temperatures, which enables the use of any of a variety of relatively inexpensive supports, such as flexible polymeric supports. Thus, the process enables production of relatively inexpensive circuits containing thin film transistors with significantly improved performance.

In one preferred embodiment, the present process offers a significant departure from conventional approaches to making thin films that can be adaptable to patterning of thin films on relatively large and web-based substrates and capable of achieving improved throughput speeds.

The process of the present invention optionally allows operation at atmospheric or near-atmospheric pressures and is capable of operating in an unsealed or open-air environment.

The functional material that is deposited as a thin film after patterning the deposition inhibitor material includes a variety of inorganic materials that are metals or that comprise a metal-containing compound. Such metal-containing compounds include, for example (with respect to the Periodic Table) a Group V or Group VI anion. Such metal-containing compound can, for example, include oxides, nitrides, sulfides or phosphides of zinc, aluminum, titanium, hafnium, zirconium or indium, or combinations thereof. Metals include, for example, copper, tungsten, aluminum, nickel, ruthenium, or rhodium.

Oxides that can be made using the process include, but are not limited to: zinc oxide (ZnO), aluminum oxide ($Al_2O_3$), hafnium oxide, zirconium oxide, indium oxide, tin oxide, and the like. Mixed structure oxides that can be made using the process of the present invention can include, for example, InZnO. Doped materials that can be made using the process of the present invention can include, for example, ZnO:Al, $Mg_xZn_{1-x}O$, and LiZnO.

Metals that can be made using the process include, but are not limited to: copper, tungsten, aluminum, nickel, ruthenium, and/or rhodium. It will be apparent to the skilled artisan that alloys of two, three, or more metals may be deposited, compounds may be deposited with two, three, or more constituents, and such things as graded films and nano-laminates may be produced as well.

For various precursors of functional materials that can be deposited in ALD thin film processes, reference is made to the Handbook of *Thin Film Process Technology*, Vol. 1, edited by Glocker and Shah, Institute of Physics (IOP) Publishing, Philadelphia 1995, pages B1.5:1 to B1.5:16, hereby incorporated by reference; and *Handbook of Thin Film Materials*, edited by Nalwa, Vol. 1, pages 103 to 159, hereby incorporated by reference, including Table V1.5.1 of the former reference.

In one embodiment of the present process, in which an ALD process is used to deposit the functional material, a given area of the substrate, on which the photopatternable deposition inhibitor material has bee applied, is exposed to a gas flow for less than 500 milliseconds, preferably less than 100 milliseconds. Preferably, the temperature of the substrate during deposition is under 300° C., more preferably under 250° C.

For example, in one particular application, it was found that each O-M cycle formed a layer of one atomic diameter over about ¼ of the treated surface. Thus, four cycles, in this case, are needed to form a uniform layer of 1 atomic diameter over the treated surface. Similarly, to form a uniform layer of 10 atomic diameters in this case, then, 40 cycles would be required.

EXAMPLES

Description of the Coating Apparatus

Figure 3:
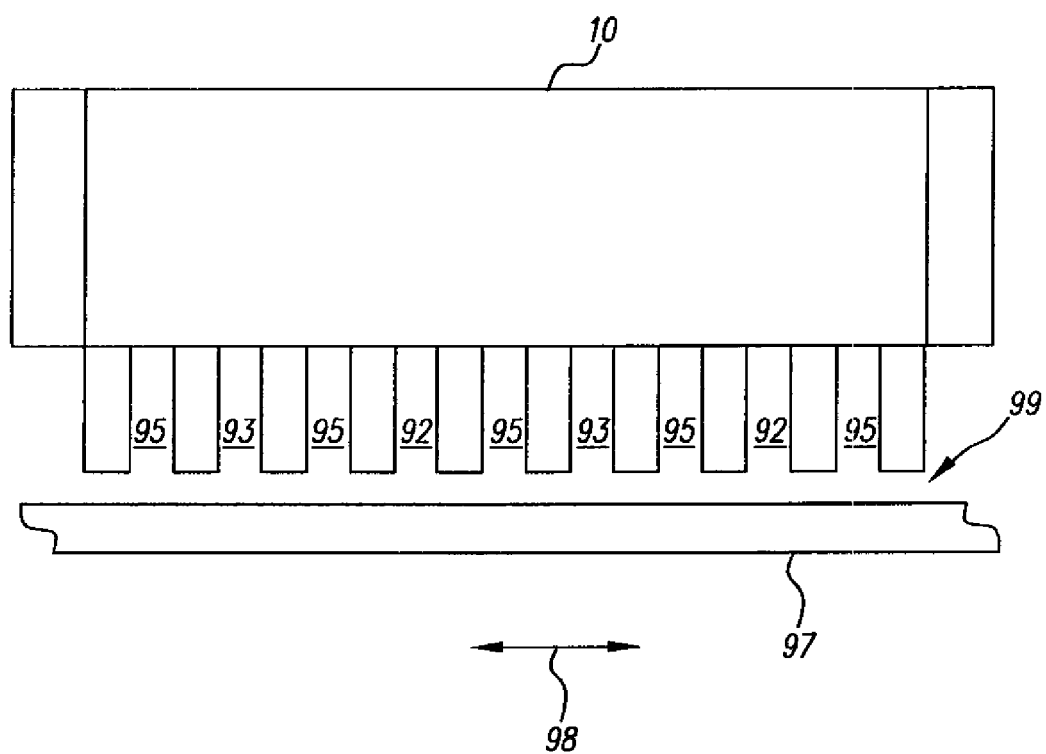
FIG. 3 is a cross-sectional side view of a deposition device used in one embodiment of the present process, in an example, showing the arrangement of gaseous materials provided to a substrate that is subject to thin film deposition process of the Examples.
Figure 4:
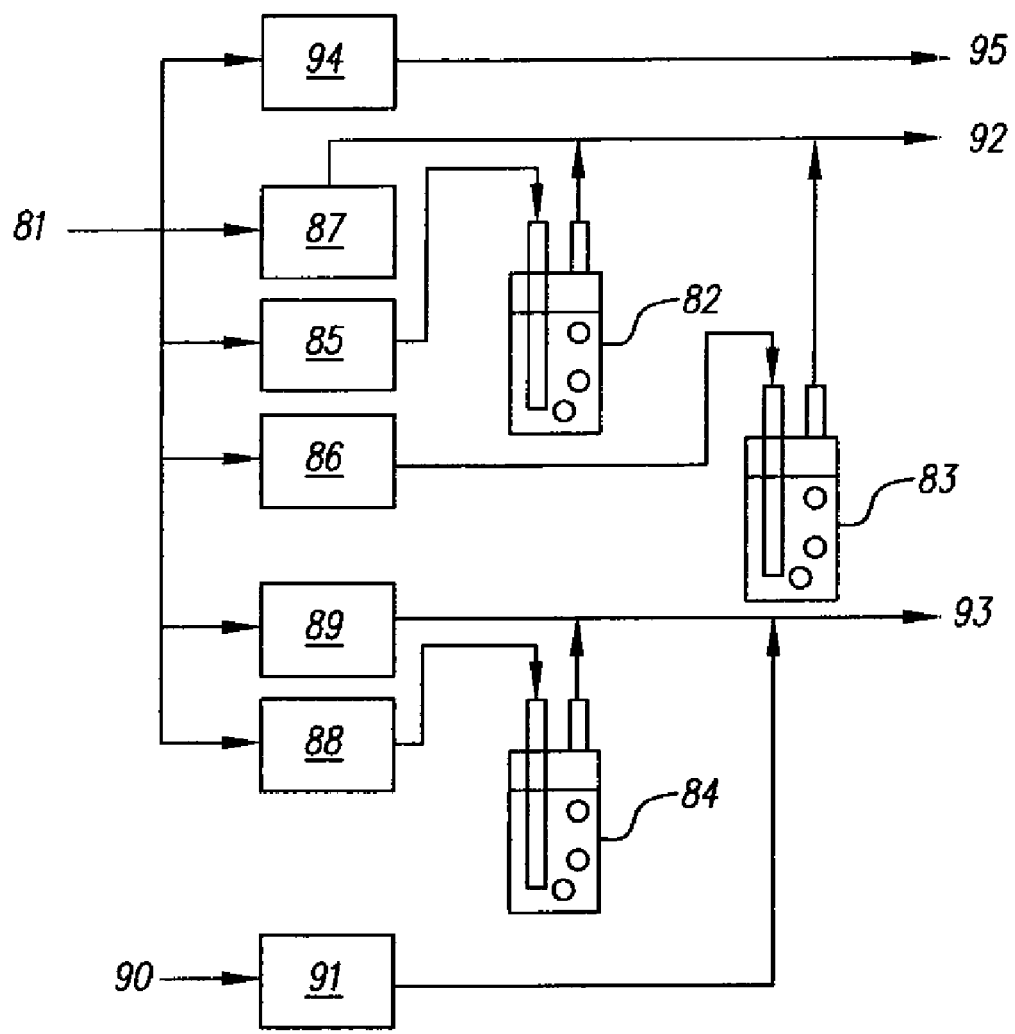
FIG. 4 is a side view of the gas delivery apparatus for supplying gases to the deposition device of FIG. 3, showing the arrangement of gaseous materials provided to a substrate that is subject to the process of the Examples.

All of the following thin film examples employ a flow setup as indicated in FIGS. 3 and 4. The flow setup is supplied with nitrogen gas flow 81 that has been purified to remove oxygen and water contamination to below 1 ppm. The gas is diverted by a manifold to several flow meters which control flows of purge gases and of gases diverted through bubblers to select the reactive precursors. In addition to the nitrogen supply, air flow 90 is also delivered to the apparatus. The air is pretreated to remove moisture.

The following flows are delivered to the ALD coating apparatus 10: metal precursor flow 92 containing metal precursors diluted in nitrogen gas; oxidizer-containing flow 93 containing non-metal precursors or oxidizers diluted in nitrogen gas; nitrogen purge flow 95 composed only of the inert gas. The composition and flows of these streams are controlled as described below.

Gas bubbler 82 contains liquid diethylzinc (DEZ). Flow meter 85 delivers flows of pure nitrogen to the diethylzinc bubbler 82. The output of the bubbler 82 now contains nitrogen gas saturated with the respective precursor solution.

Gas bubbler 83 contains liquid dimethylaluminum isopropoxide (DMAI). Flow meter 86 delivers flows of pure nitrogen to the dimethylaluminum isopropoxide bubbler 83. The output of the bubbler 83 now contains nitrogen gas saturated with the respective precursor solution. The output flow of the DMAI and DEZ bubblers is mixed with a nitrogen gas dilution flow delivered from flow meter 87 to yield the overall flow of metal precursor flow 92. In the following examples, the flows will be as follows:

Flow meter 85: To diethylzinc Bubbler Flow
Flow meter 86: To Dimethylaluminum isopropoxide Bubbler Flow
Flow meter 87: To Metal Precursor Dilution Flow Gas bubbler 84 contains pure water at room temperature. Flow meter 88 delivers a flow of pure nitrogen to gas bubbler 84, the output of which represents a stream of saturated water vapor. An airflow is controlled by flow meter 91. The water bubbler output and air streams are mixed with dilution stream from flow meter 89 to produce the overall flow of oxidizer-containing flow 93 which has a variable water vapor composition, nitrogen composition, and total flow. In the following examples, the flows will be as follows:

Flow meter 88: To Water Bubbler
Flow meter 89: To Oxidizer Dilution Flow
Flow meter 91: To Air Flow Flow meter 94 controls the flow of pure nitrogen that is to be delivered to the coating apparatus.

Streams or Flows 92, 93, and 95 are then delivered to an atmospheric pressure coating head where they are directed out of the channels or microchamber slots as indicated in FIG. 3. A gap 99 of approximately 0.15 mm 30 microns exists between the elongated channels and the substrate 97. The microchambers are approximately 2.5 mm tall, 0.86 mm wide, and run the length of the coating head which is 76 mm. The reactant materials in this configuration are delivered to the middle of the slot and flow out of the front and back.

In order to perform a deposition, the delivery head is positioned over a portion of the substrate 97 and then moved in a reciprocating fashion over the substrate 97, as represented by the arrow 98. The length of the reciprocation cycle was 32 mm. The rate of motion of the reciprocation cycle is 30 mm/sec.

Materials Used (1) Si wafer substrates, cut to 2.5×2.5" squares, previously cleaned in Piranha solution, washed with distilled water, reagent ethanol and dried.

(2) Dimethylaluminum isopropoxide (commercially available from Strem Chemical Co.).

(3) Diethylzinc (commercially available from Aldrich Chemical Co.)

DEHESIVE 944 is a vinyl-terminated dimethylsiloxane polymer supplied by Wacker Chemie AG. Crosslinker V24 is a methylhydrogenpolysiloxane supplied by Wacker. Catalyst OL is an organoplatinum complex in polydimethylsiloxane, also supplied by Wacker. Crosslinker V24 and Catalyst OL are used for additional curing of vinyl-terminated siloxane polymers such as DEHESIVE 944.

950 PMMA is a poly(methyl methacrylate) based positive working photoresist supplied by MicroChem.

HNR-80, Waycoat Negative Resist Developer (WNRD), and OCG Rinse 1 were obtained from Fujifilm Electronic Materials. HNR-80 is a UV-sensitive negative photoresist, containing cyclized rubber (poly(cis-isoprene)) as a photo-crosslinkable material dispersed in a mixture of xylene and ethylbenzene. WNRD is a xylene free developer for polyisoprene based negative resists, and was used as a developer for HNR-80 formulations. OCG Rinse 1, primarily containing butyl acetate, was used as the rinse for HNR-80 formulations following the development step.

Photosensitivity

The relative photosensitivity of the photopatternable coatings described below was estimated using nominal radiometer readings with an IL440 Photoresist Radiometer.

Example 1

Preparation of $Al_2O_3$ Dielectric Layer Using Atmospheric Pressure ALD Process This example describes the preparation of a thin film coating of an $Al_2O_3$ layer on a Si wafer substrate, which can be applied over a photopatterned deposition inhibitor material according to the present process. The device used to prepare the $Al_2O_3$ and ZnO layers has been described in detail in U.S. patent application Ser. No. 11/627,525, hereby incorporated by reference in its entirety. A 2.5×2.5 inch square (62.5 mm square) Si wafer was positioned on the platen of this device, held in place by a vacuum assist and heated to 200° C. The platen with the Si substrate was positioned under the coating head that directs the flow of the active precursor gasses. The spacing between the Si wafer substrate and the coating head was adjusted using a micrometer to 30 microns.

The coating head has isolated channels through which flow: (1) inert nitrogen gas; (2) a mixture of nitrogen, air and water vapor; and (3) a mixture of active metal alkyl vapor (DMAI) in nitrogen. The flow rate of the active metal alkyl vapor was controlled by bubbling nitrogen through the pure liquid DMAI contained in an airtight bubbler by means of individual mass flow control meters. Due to the relatively low vapor pressure of DMAI at room temperature the DMAI bubbler and delivery line to the coating head were heated to 60° C. The temperature of the coating head was also maintained at 60° C. The flow of water vapor was controlled by adjusting the bubbling rate of nitrogen passed through pure water in a bubbler. Adjusting the flow rates of the individual gasses to the settings shown in Table 1, for Example 1 below, the coating process was initiated by oscillating the coating head across the substrate for the number of cycles specified. The finished coating was a completely uniform deposit of $Al_2O_3$ having an average thickness of 1125 Å.

TABLE 1

| Sample | Layer | $Me_2Al$—$iOPr$* | $Et_2Zn$ | Water | $N_2$ carrier with Metal Alkyl | $N_2$ carrier for water | $N_2$ Inert Purge | Cycles | Substrate Temperature, ° C. |
|---|---|---|---|---|---|---|---|---|---|
| 1 | $Al_2O_3$ | 100 | 0 | 15 | 45 | 90 | 644 | 400 | 200 |
| 2 | ZnO | 0 | 13 | 15 | 45 | 90 | 644 | 300 | 200 |

*Flow values in sccm (standard cubic centimeters/min)

Example 2

Preparation of ZnO Semiconductor Layer Using Atmospheric Pressure ALD Process

This example describes the preparation of a thin film coating a ZnO layer on a Si wafer substrate, which can be applied over a photopatterned deposition inhibitor material according to the present process. A 2.5×2.5 inch square (62.5 mm square) Si wafer was positioned on the platen of the ALD device, held in place by a vacuum assist and heated to 200° C. The platen with the Si substrate was positioned under the coating head that directs the flow of the active precursor gasses. The spacing between the Si wafer substrate and the coating head was adjusted using a micrometer to 30 microns.

The coating head has isolated channels through which flow: (1) inert nitrogen gas; (2) a mixture of nitrogen, air, and water vapor; and (3) a mixture of active metal alkyl vapor (Diethyl zinc, DEZ) in nitrogen. The flow rate of the active metal alkyl vapor was controlled by bubbling nitrogen through the pure liquid DEZ contained in an airtight bubbler by means of individual mass flow control meters. The flow of water vapor was controlled by adjusting the bubbling rate of nitrogen passed through pure water in a bubbler. Adjusting the flow rates of the individual gasses to the settings shown in Table 1, for Example 2 below, the coating process was initiated by oscillating the coating head across the substrate for the number of cycles specified. The finished coating was a completely uniform deposit of ZnO having an average thickness of 565 Å.

Comparative Example 3

Preparation of a Patterned $Al_2O_3$ Dielectric Layer by a Photopatterned Organosiloxane Deposition Inhibitor Using Atmospheric Pressure ALD Process This example, for comparison to the present process, describes a deposition inhibitor material that is ineffectively photopatternable. A thin film coating of a patterned $Al_2O_3$ layer (Sample 2) was prepared, comprised of a Si wafer substrate, a patterned layer of a SAD polymer, a 1100 Å thick $Al_2O_3$ dielectric layer that is deposited in the areas that the SAD polymer does not cover.

Solutions of Part A and Part B of Dehesive 944 were prepared by dissolving ingredients in a mixture of toluene and heptane according to the formulation specified in Table 2. Equal amount of Parts A and B were then mixed and diluted by a factor of 10 using a mixture of toluene and heptane (33/48 ratio) to form the stock solution of Dehesive 944.

TABLE 2

| Ingredient | Part A | Part B |
|---|---|---|
| Dehesive 944 (30% Solid) | 90.0 | 90.0 |
| Crosslinker V24 | 0.1 | 0.0 |
| Catalyst OL | 0.0 | 3.0 |
| Toluene | 2000.0 | 2000.0 |
| Heptane | 2910.0 | 2910.0 |

The patterned layer of a deposition inhibition polymer was prepared according the following steps:

1. Spin coating a mixture of 5 parts of 0.4% of 950 PMMA solution in Anisole/toluene and 1 part of the DEHESIVE 944 polysiloxane in toluene/heptane at 3000 rpm.

2. After heating at 120 to 180° C. for 1-2 minutes, the coated sample was exposed under deep UV for 5-15 minutes through a gridline-patterned photomask in presence of nitrogen.

3. The exposed sample was then developed by toluene for 45 to 90 seconds, followed by 3 rinses. Exposed area was removed during the development step.

The substrate with a patterned layer of deposition inhibition polymer was then subjected to $Al_2O_3$ deposition. The patterned $Al_2O_3$ coating is prepared identically to that procedure in Example 1 above. The finished patterned coating appeared as a sharp gridline pattern of $Al_2O_3$ lines. Although the deposition was highly selective, the sensitivity of this photopatternable deposition inhibitor formulation was approximately 3400 $mJ/cm^2$ at 250 nm, too low in effective sensitivity for practical manufacture of patterned coatings.

Comparative Example 4

Deposition of $Al_2O_3$ Layer Over-Photopatternable Coating without Siloxane

This example, for comparison to the present process, describes a photopatternable material that does not contain organosiloxane. Half of a Si wafer was taped off by scotch tape, and HNR-80 photoresist was spun onto the untaped half. The tape was removed, and the photoresist coating was exposed and developed according to manufacturers recommendations. The taped side was wiped with methanol to remove tape residue (the photoresist coated side was not wiped). The substrate with a patterned layer of deposition inhibition polymer was then subjected to $Al_2O_3$ deposition. The patterned $Al_2O_3$ coating is prepared identically to that procedure in Example 1 above. After the deposition, a uniform film of $Al_2O_3$ with an average thickness of 1100 Å was formed on the un-protected side of the wafer, and 980 Å was deposited on the photoresist-covered side. This result indicated the photoresist had only a slight capability to inhibit deposition of alumina. For simplicity of reporting, the inhibition power is defined as the layer thickness at or below which there is substantially no thin film formed on the deposition inhibitor surface. The sensitivity of this photoresist of only ~100 $mJ/cm^2$ was substantially better than the photopatternable material described in Comparative Example 3. However, the inhibition power of this photopatternable coating was only 120 Å, too thin for many typical applications.

Example 5

Selective Deposition with Visible Light Curable Deposition Inhibitor

A photopatternable deposition inhibitor coating sensitive to blue light was prepared in the following manner. A 0.1% solution of Photoinitiator A (Table 3 below) in anisole was prepared. A dehesive solution was prepared that contained 1.08% DEHESIVE 944, 0.002% Crosslinker V24, and 0.06% Catalyst OL in a mixture of 33 parts toluene and 48 parts heptane, and 0.85 g of toluene. A stock solution was prepared that contained 3.3 g of a 1% solution of polymethylmethacrylate dissolved in toluene, 0.5 g of a 10% solution of TMPTA in toluene, 0.24 g of the photoinitiator solution, and 0.85 g of toluene. To this solution, 0.5 g of the dehesive solution was added. One gram of this stock solution was diluted with 5 g of toluene. The solution was spin coated at 2000 RPM, baked at 80° C. for one minute, exposed using blue light, and developed using MIBK, forming a negative resist image. The sensitivity of this photopatternable coating was approximately ~5 $mJ/cm^2$, was nearly 3 orders of magnitude more sensitive than the photopatternable material described in Comparative Example 3. After the photosensitive coating was developed, an aluminum oxide coating was selectively deposited on regions not masked by the photopatterned deposition inhibitor. The patterned $Al_2O_3$ coating was prepared identically to that procedure in Example 1 above. Ellipsometry data indicated the photopatterned deposition inhibitor coating had an inhibition power of 500 Angstroms.

TABLE 3

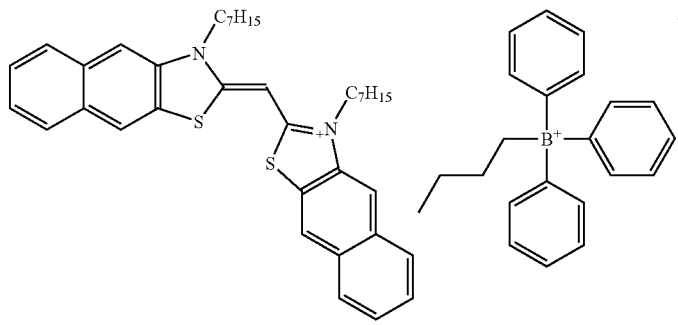

Example 6

Selective Deposition of Al₂O₃ Photopatternable Deposition Inhibitor

In this example, a photopatternable coating is prepared in the same way as for Example 4, with the exception that an organosiloxane is added to the coating solution, and the resulting coating is exposed to a pattern of UV light, and developed. An alumina layer is selectively deposited over the photopatterned deposition inhibitor material.

A dehesive solution was prepared containing 0.108% DEHESIVE 944, 0.0002% Crosslinker V24, and 0.006% Catalyst OL in a mixture of 33 parts toluene and 48 parts heptane. A coating solution was prepared that contained 1.25 g of HNR-80, 23.75 g of toluene, and 0.5 g of the dehesive solution. The resulting solution was spin coated at 2000 RPM for 1 minute, baked at 90° C. for 1 minute, exposed with a pattern of UV light, developed in WNRD, and rinsed with OCG Rinse. The substrate with a photopatterned layer of deposition inhibition polymer was then subjected to Al₂O₃ deposition. The patterned Al₂O₃ coating is prepared identically to that procedure in Comparative Example 1 above. Ellipsometry data indicated the photopatterned deposition inhibitor coating had an inhibition power of 750 Angstroms, substantially better than the results from Comparative Example 4.

Example 7

Deposition of ZnO Layer over Photopatternable coating with Siloxane

A photopatternable deposition inhibitor coating was prepared, exposed, and developed according to the procedure described for Example 6 above, with the exception that visible light sensitizer 9-fluorenone was added to the coating solution and the coating was exposed to a pattern of blue light. 0.04 g of a 1% solution of 9-fluorenone in xylene was added to 5 g of the coating solution used for Example 6. The resulting solution was coated, exposed to a pattern of blue light, and developed using the same procedure as for Example 6. After the photosensitive coating was developed, a zinc oxide coating was selectively deposited on regions not masked by the photopatterned deposition inhibitor, using the same coating device as for Comparative Example 2. Ellipsometry data indicated the photopatternable coating C-12 had an inhibition power of 850 Angstroms.

The invention claimed is:

1. A process for forming a patterned thin film comprising:
   (a) providing a substrate;
   (b) applying a composition comprising a photopatternable deposition inhibitor material to the substrate, wherein the deposition inhibitor material comprises an organosiloxane that is a selective deposition inhibitor;
   (c) exposing the photopatternable deposition inhibitor material to imaging actinic radiation to form a pattern which is composed of deposition inhibitor material in a second exposed state that is different from an first as-coated state;
   (d) patterning the deposition inhibitor material to provide selected areas effectively not having the deposition inhibitor material by processing the exposed photopatternable deposition inhibitor material; and
   (e) depositing layer of functional material on the substrate by a vapor phase deposition process;
   wherein the functional material is substantially deposited only in the selected areas of the substrate not having the deposition inhibitor material, wherein the functional material is a metal or comprises a metal-containing compound, and wherein the functional material is deposited by a vapor phase deposition process that is an atomic layer deposition process.

2. The process of claim 1 further comprising removing the deposition inhibitor material after depositing the functional material.

3. The process of claim 1 wherein the organosiloxane is a polymer that comprises a vinyl terminated siloxane that is crosslinked.

4. The process of claim 1 wherein the organosiloxane is a fluorinated or partially fluorinated organosiloxane.

5. The process of claim 1 wherein the photopatternable deposition inhibitor material further comprises an initiator system, for ethylenic addition polymerization, containing, as a photoinitiator, a dye capable of absorbing imaging actinic radiation to achieve an excited state.

6. The process of claim 1 wherein said photopatternable deposition inhibitor material further comprises, in addition to a organosiloxane, a photopatternable material comprising at least one addition-polymerizable ethylenically-unsaturated compound selected from the group consisting of monomers, oligomers, or crosslinkable polymers and mixtures thereof, and having a boiling point above 100 degrees C. at normal pressure.

7. The process of claim 6 wherein the photopatternable material is a multifunctional acrylate.

8. The process of claim 1 wherein the photopatternable deposition inhibitor material further comprises a photopatternable material that comprises a cyclized poly(cis-isoprene) and sensitized to UV radiation with a bis-azide, optionally sensitized to visible wavelengths with a dye sensitizer.

9. The process of claim 1 wherein said organosiloxane is photopatternable and comprises at least one addition-polymerizable ethylenically-unsaturated compound selected from the group consisting of monomers, oligomers, or crosslinkable polymers and mixtures thereof, and having a boiling point above 100 degrees C. at normal pressure.

10. The process of claim 1 wherein the photopatternable deposition inhibitor material is exposed to actinic radiation through a photomask or, using a laser, in the absence of a photomask.

11. The process of claim 1 wherein the metal-containing compound comprises a group V or group VI anion.

12. The process of claim 1 wherein the metal-containing compound is an oxide, nitride, sulfide, or phosphide.

13. The process of claim 1 wherein the metal-containing compound contains zinc, aluminum, titanium, hafnium, zirconium, and/or indium.

14. The process of claim 1 wherein the metal is copper, tungsten, aluminum, nickel, ruthenium, or rhodium.

15. The process of claim 1 wherein the atomic layer deposition process comprises spatially dependent ALD.

16. The process of claim 1 wherein the organosiloxane is selected from the group consisting of poly(dimethylsiloxane), poly(diphenylsiloxane), poly(methylphenylsiloxane), poly(dimethyldiphenylsiloxane), mereaptopropyl-functtionalized poly(dimethylsiloxane), aminopropyl-functionalized poly(dimethylsiloxane), carboxypropyl-functionalized poly(dimethylsiloxane), silane-funtionalized poly(dimethylsiloxane), and trifluoropropyl-functionalized poly(dimethylsiloxane).

17. The process of claim 1 wherein the organosiloxhane comprises poly(dimethylsiloxane) (PDMS) or poly(dimethyldiphenylsiloxane.

* * * * *

UNITED STATES PATENT AND TRADEMARK OFFICE
CERTIFICATE OF CORRECTION

PATENT NO.         : 7,846,644 B2
APPLICATION NO.    : 11/942780
DATED              : December 7, 2010
INVENTOR(S)        : Irving et al.

It is certified that error appears in the above-identified patent and that said Letters Patent is hereby corrected as shown below:

Column 33, Line 54, delete "photopattemable" and insert -- photopatternable --.

Column 34, Line 13, delete "photopattemable" and insert -- photopatternable --.

Column 34, Line 20, delete "photopattemable" and insert -- photopatternable --.

Column 34, Line 28, delete "photopattemable" and insert -- photopatternable --.

Column 34, Line 34, delete "photopattemable" and insert -- photopatternable --.

Column 34, Line 39, delete "photopattemable" and insert -- photopatternable --.

Column 34, Line 57-58, delete "mereaptopropyl-functtionalized" and insert
-- mercaptopropyl-functionalized --.

Column 34, Line 60, delete "silane-funtionalized" and insert -- silane-functionalized --.

Column 34, Line 63, delete "organosiloxhane" and insert -- organosiloxhane-functional --.

Column 34, Line 64-65, after "poly(dimethyldiphenylsiloxane" add -- ) --.

Signed and Sealed this
Nineteenth Day of March, 2013

Teresa Stanek Rea
*Acting Director of the United States Patent and Trademark Office*